US008981986B2

(12) United States Patent
Seppinen et al.

(10) Patent No.: US 8,981,986 B2
(45) Date of Patent: Mar. 17, 2015

(54) ANALOGUE TO DIGITAL CONVERTER

(71) Applicant: Broadcom Corporation, Irvine, CA (US)

(72) Inventors: Pauli Mikael Seppinen, Vantaa (FI); Markus Nentwig, Helsinki (FI); Sami Seppo Antero Kallioinen, Espoo (FI); Kim Kaltiokallio, Helsinki (FI)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/966,325

(22) Filed: Aug. 14, 2013

(65) Prior Publication Data
US 2014/0049416 A1    Feb. 20, 2014

(30) Foreign Application Priority Data

Aug. 14, 2012 (GB) .................................. 1214513.2

(51) Int. Cl.
| H03M 1/50 | (2006.01) |
| H03M 1/34 | (2006.01) |
| H03M 1/12 | (2006.01) |
| H03M 1/36 | (2006.01) |

(52) U.S. Cl.
CPC .............. *H03M 1/34* (2013.01); *H03M 1/1245* (2013.01); *H03M 1/361* (2013.01)
USPC ........... 341/158; 341/155; 341/160; 341/159; 341/156

(58) Field of Classification Search
CPC ...... H03M 1/34; H03M 1/361; H03M 1/1245
USPC .................................................. 341/130–160
See application file for complete search history.

(56) References Cited

U.S. PATENT DOCUMENTS

| 5,519,398 | A | 5/1996 | Satoh et al. | |
| 6,064,325 | A * | 5/2000 | Fields et al. | 341/137 |
| 7,474,235 | B2 * | 1/2009 | Hsieh et al. | 341/61 |
| 7,903,006 | B2 * | 3/2011 | Hsieh et al. | 341/110 |
| 8,149,146 | B2 * | 4/2012 | Hsieh et al. | 341/61 |
| 2007/0279274 | A1 * | 12/2007 | Hsieh et al. | 341/155 |
| 2010/0176982 | A1 | 7/2010 | Lachartre | |
| 2011/0279736 | A1 * | 11/2011 | Tang et al. | 348/731 |

FOREIGN PATENT DOCUMENTS

| DE | 3425399 | 1/1986 |
| EP | 0268929 | 6/1988 |
| WO | 2011114392 | 9/2011 |

* cited by examiner

*Primary Examiner* — Lam T Mai
(74) *Attorney, Agent, or Firm* — Oblon, McClelland, Maier & Neustadt, L.L.P.

(57) ABSTRACT

Measures are provided for performing direct radio-frequency to digital conversion. A radio-frequency input signal is compared with a plurality of reference voltages to generate a plurality of comparison signals, each comparison signal corresponding to one of the plurality of reference voltages. One or more of the plurality of generated comparison signals are first filtered to generate a first filtered signal. One or more of the plurality of generated comparison signals are second filtered to generate a second filtered signal. A digital output signal is generated at least on the basis of the first filtered signal and the second filtered signal.

24 Claims, 8 Drawing Sheets

ND CONVERTER

CROSS REFERENCE TO RELATED APPLICATION

This application claims benefit under 35 U.S.C. §119(a) and 37 CFR 1.55 to UK patent application no. GB 1214513.2, filed on 14 Aug. 2012, the entire content of which is hereby incorporated by reference.

TECHNICAL FIELD

The present disclosure relates to analogue to digital conversion. In particular, but not exclusively, the present disclosure relates to measures for performing direct radio-frequency to digital conversion.

BACKGROUND

Analogue to digital conversion is an integral part of a number of technologies, in particular radio communication technologies. Radio communication schemes transmit data via a transport medium, such as the air, in the form of analogue signals. Such analogue signals typically comprise a radio-frequency (RF) frequency carrier component modulated by one or more lower frequency data components. Modern radio communication equipment utilises digital signal processing to operate on at least the data components of received signals. Hence, analogue to digital conversion is required before the data components of received signals can be processed.

Generally, analogue to digital converters sample an analogue input signal periodically and produce a digital representation of the magnitude of the analogue input signal at the time of the sample. The accuracy of the digital representation depends on the number of quantisation levels the analogue to digital converter has. The digital representation is typically generated on the basis of the quantisation level that is closest to the magnitude of the analogue input signal at the time of the sample. The range of different quantisation levels provided is termed the operating range of the analogue to digital converter. The spacing of the quantisation levels defines the resolution of the analogue to digital converter.

In order to accurately represent an analogue signal as a digital signal, the sampling rate of the analogue to digital converter should sample the analogue signal at a rate equivalent to at least half the frequency of the highest frequency of interest in the analogue signal. If this criterion (known as the Nyquist criterion) is not met, then aliasing of the signal may occur during the conversion. The maximum sampling rate of an analogue to digital converter is most commonly limited by the throughput of the analogue to digital converter. Hence, many conventional receiver arrangements convert the data components of received signals to a lower frequency before performing analogue to digital conversion. A receiver arrangement (or operation, process, apparatus, method, etc.) that does not involve such a conversion to a lower frequency may be referred to as a direct radio-frequency to digital conversion receiver arrangement.

Frequency down-conversion is typically achieved by mixing the signal with a local oscillator signal operating near the carrier frequency of the received RF signal. The down-converted signal is then filtered, typically using a low pass filter, to remove signal components outside the desired frequency range. Frequency down-conversion may convert the signals of interest directly to baseband or low frequency, or may alternatively use multiple down-conversion stages and one or more intermediate frequencies. The result of this frequency down-conversion is to move the frequency of the signals of interest to within the operating frequency range of the given analogue to digital converter arrangement.

More recently, direct RF to digital converters have been used that convert a received RF signal to a digital signal without first performing down-conversion on the received signal. Due to the high sampling rate required of an analogue to digital converter used as a direct RF to digital converter, suitable architectures often have undesirable characteristics, such as small number of quantisation levels, high cost/semiconductor area, high power consumption, etc.

A known analogue to digital converter arrangement capable of operating at suitably high sampling rates is known in the art as a flash converter. A flash converter utilises a number of comparators, each arranged to compare an analogue input signal with a different reference voltage. The various reference voltages are distributed over the operating voltage range of the flash converter. The comparators are arranged in parallel such that each consecutive comparator utilises an increasing reference voltage. The result of this arrangement is that the output of the comparators is thermometer coded. An encoder is then used to convert the thermometer coded comparator output into a binary coded signal using priority encoding logic.

Due to the priority encoding logic required and the necessary throughput, encoder hardware scales poorly when an increasing number of comparators is used. As a result, flash converters with high resolutions are rarely used at high sampling rates. Further, the output of a flash converter is clocked at the sampling sate of the flash converter, which, at radio-frequencies, is typically too fast to be processed by conventional communication equipments.

Hence, it would be desirable to provide improved measures for performing direct RF to digital conversion.

SUMMARY

In accordance with first embodiments there is a method of performing direct radio-frequency to digital data component conversion, the method including:

comparing a radio-frequency input signal with a plurality of reference voltages to generate a plurality of comparison signals, each comparison signal corresponding to one of the plurality of reference voltages;

first filtering one or more of the plurality of generated comparison signals to generate a first filtered signal;

second filtering one or more of the plurality of generated comparison signals to generate a second filtered signal; and generating a digital output signal at least on the basis of the first filtered signal and the second filtered signal, wherein the first filtering and the second filtering act to isolate a data component of the radio-frequency input signal.

In accordance with second embodiments there is a direct radio-frequency to digital data component conversion apparatus, the apparatus including:

a comparator, adapted to compare a radio-frequency input signal with a plurality of reference voltages to generate a plurality of comparison signals, each comparison signal corresponding to one of the plurality of reference voltages;

a first filter, adapted to filter one or more of the plurality of generated comparison signals to generate a first filtered signal;

a second filter, adapted to filter one or more of the plurality of generated comparison signals to generate a second filtered signal; and a generator, adapted to generate, a digital output signal on the basis of at least the first filtered signal and the second filtered signal, wherein the first filtering and the second filtering act to isolate a data component of the radio-frequency input signal.

In accordance with third embodiments there is a computer program product including a non-transitory computer-readable storage medium having computer readable instructions stored thereon, the computer readable instructions being executable by a computerized device to cause the computerized device to perform a method for use in performing direct radio-frequency to digital data component conversion, the method including:

comparing a radio-frequency input signal with a plurality of reference voltages to generate a plurality of comparison signals, each comparison signal corresponding to one of the plurality of reference voltages;

first filtering one or more of the plurality of generated comparison signals to generate a first filtered signal;

second filtering one or more of the plurality of generated comparison signals to generate a second filtered signal; and generating a digital output signal at least on the basis of the first filtered signal and the second filtered signal, wherein the first filtering and the second filtering act to isolate a data component of the radio-frequency input signal.

Further features of embodiments will become apparent from the following description of preferred embodiments, given by way of example only, which is made with reference to the accompanying drawings.

DETAILED DESCRIPTION

Embodiments of the present disclosure provide apparatus and methods for performing direct radio-frequency (RF) to digital conversion. Embodiments of the present disclosure provide apparatus and methods for obtaining a digital output signal representative of a data component of a radio-frequency input signal including a carrier component and at least one data component.

Figure 1A:
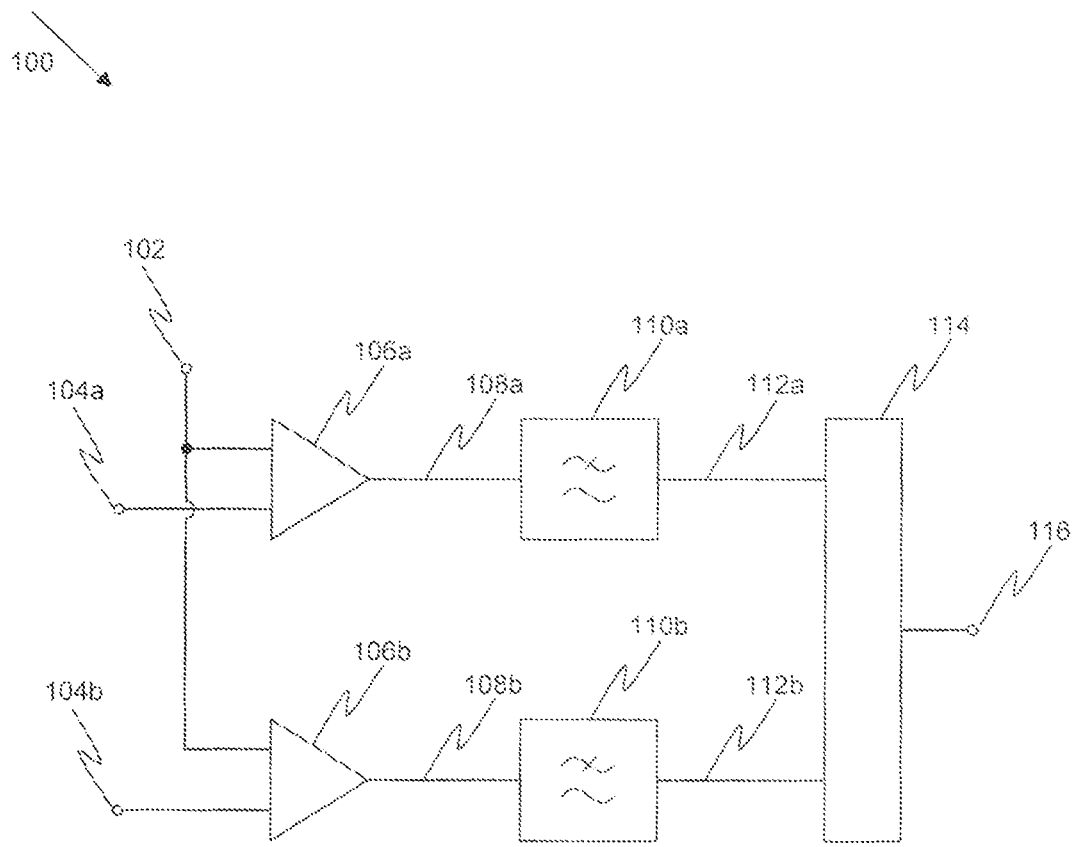
FIG. 1a shows a direct RF to digital converter 100 according to embodiments.

FIG. 1a shows a direct RF to digital converter 100 according to embodiments. A number of comparators 106a, 106b (two in this example, but more can be employed) are adapted to compare an analogue input signal, in this case RF input signal 102, to a number of reference voltages 104a, 104b. Reference voltages 104a and 104b are distributed over an operating voltage range of RF to digital converter 100. According to embodiments, reference voltages 104a and 104b are generated by a resistor ladder arrangement. The use of a resistor ladder arrangement for generating a number of reference voltages distributed over a range of interest is known in the art and will not be described herein.

Comparators 106a and 106b are adapted to compare the magnitude of RF input signal 102 at a given point in time, with reference voltages 104a and 104b respectively. The result of the comparison operations performed by comparators 106a and 106b is to generate comparison signals 108a and 108b respectively. Comparison signal 108a is generated in a first state when comparator 106a determines that the magnitude of input signal 102 is larger than reference voltage 104a, and in a second state when comparator 106a determines that the magnitude of input signal 102 is smaller than reference voltage 104a. Similarly, comparison signal 108b is generated in a first state when comparator 106b determines that the magnitude of input signal 102 is larger than reference voltage 104b, and in a second state when comparator 106b determines that the magnitude of input signal 102 is smaller than reference voltage 104b.

According to embodiments, a comparison signal being in the first state includes generating a relatively high voltage comparison signal at the given point in time, and a comparison signal being in the second state includes generating a relatively low voltage comparison signal at the given point in time. According to further embodiments, a comparison signal being in the first state includes generating a relatively low voltage comparison signal at the given point in time, and a comparison signal being in the second state includes generating a relatively high voltage comparison signal at the given point in time.

Comparison signals 108a and 108b are then filtered by filters 110a and 110b respectively to generate filtered signals 112a and 112b. By filtering comparison signals 108a and 108b, filters 110a and 110b act to isolate a data component of RF input signal 102 from unwanted signals. According to embodiments, filters 110a and 110b are low pass filters. According to embodiments, filters 110a and 110b are digital filters. According to embodiments, filters 110a and 110b are infinite impulse response (IIR) filters. Such filters are known in the art and their operation is not described herein.

Generator 114 is adapted to generate digital output signal 116 on the basis of filtered signals 112a and 112b. According to embodiments, generator 114 includes a combiner adapted to combine filtered signals 112a and 112b to generate digital output signal 116. According to embodiments, generator 114 includes an encoder, adapted to encode filtered signals 112a and 112b to generate digital output signal 116. According to embodiments, generator 114 includes digital logic circuitry for converting filtered signals 112a and 112b into a binary coded representation thereof.

By filtering each of the comparison signals 108 in parallel, direct RF to digital converter 100 enables the necessary filtering to be performed by single bit digital filters, which are fast, require low silicon area, have low current consumption and are efficiently scalable.

According to embodiments, one or more of comparison signals 108a and 108b are thermometer coded. According to embodiments, comparison signals 108a and 108b combine to form a thermometer coded signal. According to embodiments, comparison signals 108a and 108b are single bit signals.

According to embodiments, filtered signals 112a and 112b comprise thermometer coded signals. According to embodiments, generator 114 comprises a thermometer code to binary code converter.

According to embodiments, filtered signals 112a and 112b are single bit signals. According to embodiments, filtered signals 112a and 112b are multiple bit signals.

According to embodiments, the peak or average magnitude of RF input signal 102 is normalised with respect to the operating voltage range of direct RF to digital converter 100 by performing a pre-amplification operation on RF input signal 102. According to further embodiments, reference voltages 104a and 104b are configurable. According to embodiments, the values of reference voltages 104a and 104b are configured on the basis of the peak or average magnitude of RF input signal 102.

According to embodiments, a clock signal is supplied to direct RF to digital converter 100 which is used to determine the sampling rate of direct RF to digital converter 100. A clock signal typically comprises a digital pulse train with a regular cycle period. The cycle period of the clock signal determines the sampling rate of direct RF to digital converter 100. According to embodiments, the clock signal has a pre-determined frequency. According to embodiments, the frequency of the clock signal is adapted such that the sampling rate of direct RF to digital converter 100 is substantially equal to the carrier frequency of RF input signal 102. According to embodiments the clock signal is configurable to account for differences in the carrier frequency of RF input signal 102. The clock signal is used to trigger components to latch their output until a subsequent latching operation is triggered by the next cycle of the clock signal. Typically, components are triggered either by a rising or falling edge of the clock signal.

Figure 1B:
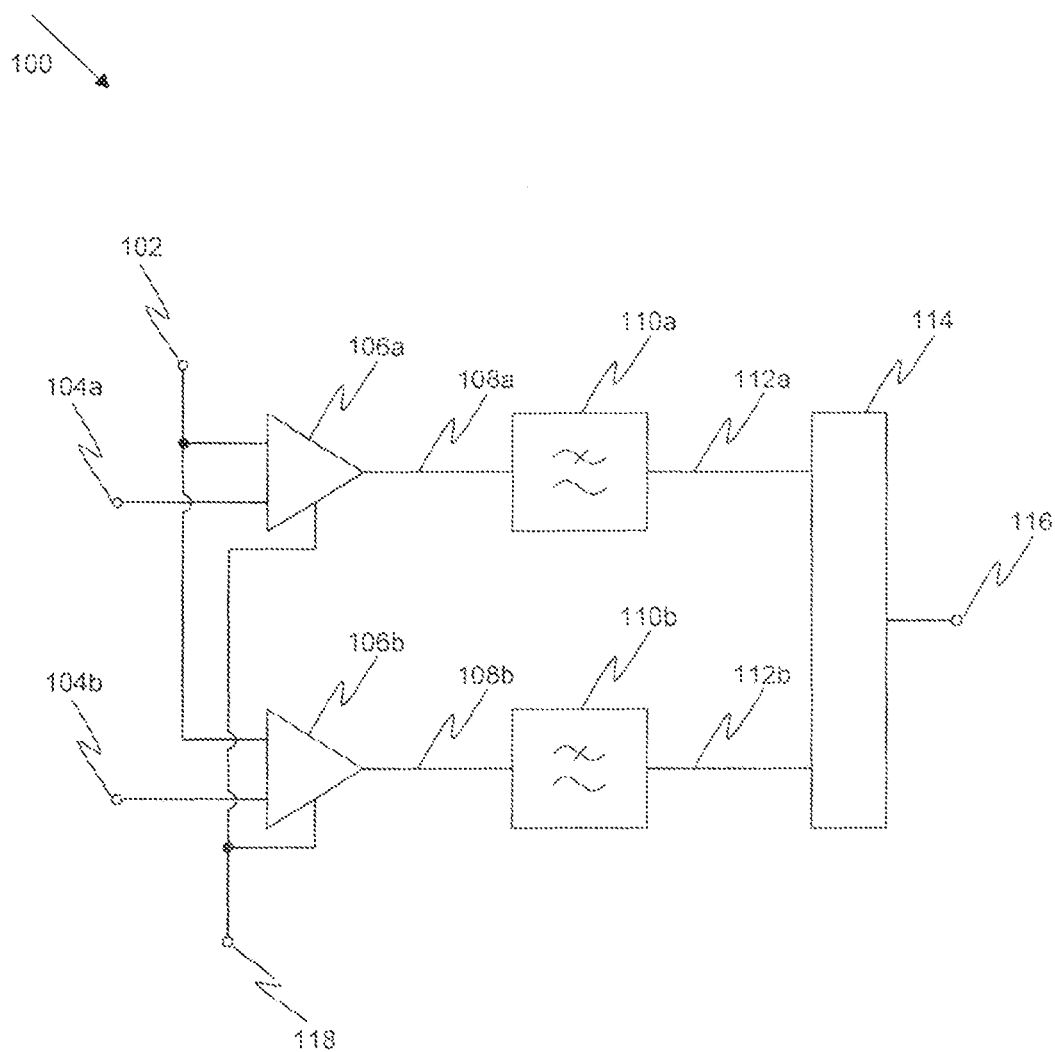
FIG. 1b shows a direct RF to digital converter 100 according to embodiments.

FIG. 1b shows a direct RF to digital converter 100 according to embodiments. The operation of input signal 102, reference voltages 104a and 104b, filters 110a and 110b, filtered signals 112a and 112b, generator 114 and digital output signal 116 are similar to as described previously in relation to FIG. 1a. However, in the embodiments of FIG. 1b, comparators 106a and 106b are further adapted to respond to clock signal 118 by latching generated comparison signals 108a and 108b at their respective outputs when triggered by clock signal 118. This process is commonly referred to as sampling, and results in comparison signals 108a and 108b being discrete time signals.

Figure 1C:
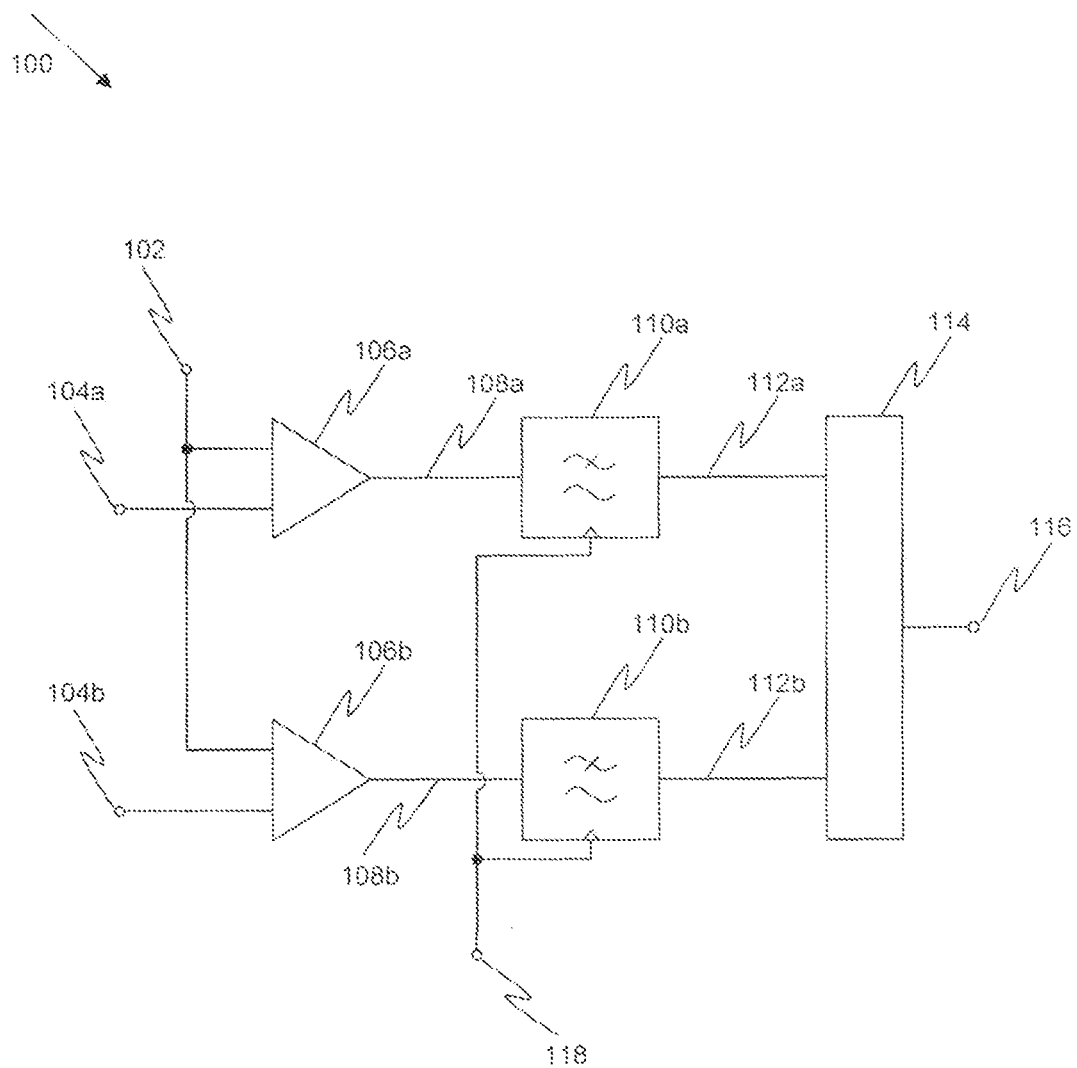
FIG. 1c shows a direct RF to digital converter 100 according to embodiments.

FIG. 1c shows a direct RF to digital converter 100 according to embodiments. The operation of input signal 102, reference voltages 104a and 104b, comparators 106a and 106b, comparison signals 108a and 108b, filtered signals 112a and 112b, generator 114 and digital output signal 116 are similar to as described previously in relation to FIG. 1a. However, in the embodiments shown in FIG. 1c, the first sampling occurs at filters 110a and 110b. Filters 110a and 110b are further adapted to react to clock signal 118 by latching comparison signals 108a and 108b at their respective inputs when triggered by clock signal 118. This latching may be comprised by a delay element incorporated in filters 110a and 110b. The result of not latching the comparison signals 108a and 108b before they are received by filters 110a and 110b is that the comparison signals 108a and 108b output by comparators 106a and 106b are continuous time signals. The clock signal supplied to filters 110a and 110b also serves to determine the rate at which filtered signals 112a and 112b are generated.

According to embodiments, clock signals may be supplied to both the comparators (106a, 106b) and the filters (108a, 108b) in order to latch the respective signals at both stages.

According to embodiments, the clock signal is adapted such that the sampling is performed according to a predetermined relationship in relation to the phase of the carrier component of RF input signal 102. In embodiments where RF input signal 102 uses quadrature encoding, this allows the in-phase and quadrature data components to be uniquely isolated from each other by RF to digital converter 100. A receiver utilising two RF to digital converters 100 may therefore obtain both the in-phase and quadrature data components by configuring the clock signal supplied to one RF to digital converter to be in phase with respect to the carrier component of RF input signal 102, and by configuring the clock signal supplied to the other RF to digital converter to be 90° out of phase with respect to the carrier component of RF input signal 102.

In the embodiments shown in FIG. 1a, two comparators (106a and 106b) are provided, which are each adapted to compare RF input signal 102, to one of two different reference voltages (104a and 104b respectively), to generate two comparison signals (108a and 108b). Each comparison signal represents one quantisation level of the direct RF to digital converter. According to embodiments, further quantisation levels are provided through the addition of further comparator and reference voltage pairings. According to embodiments, each comparison signal corresponds to a different reference voltage.

Figure 2:
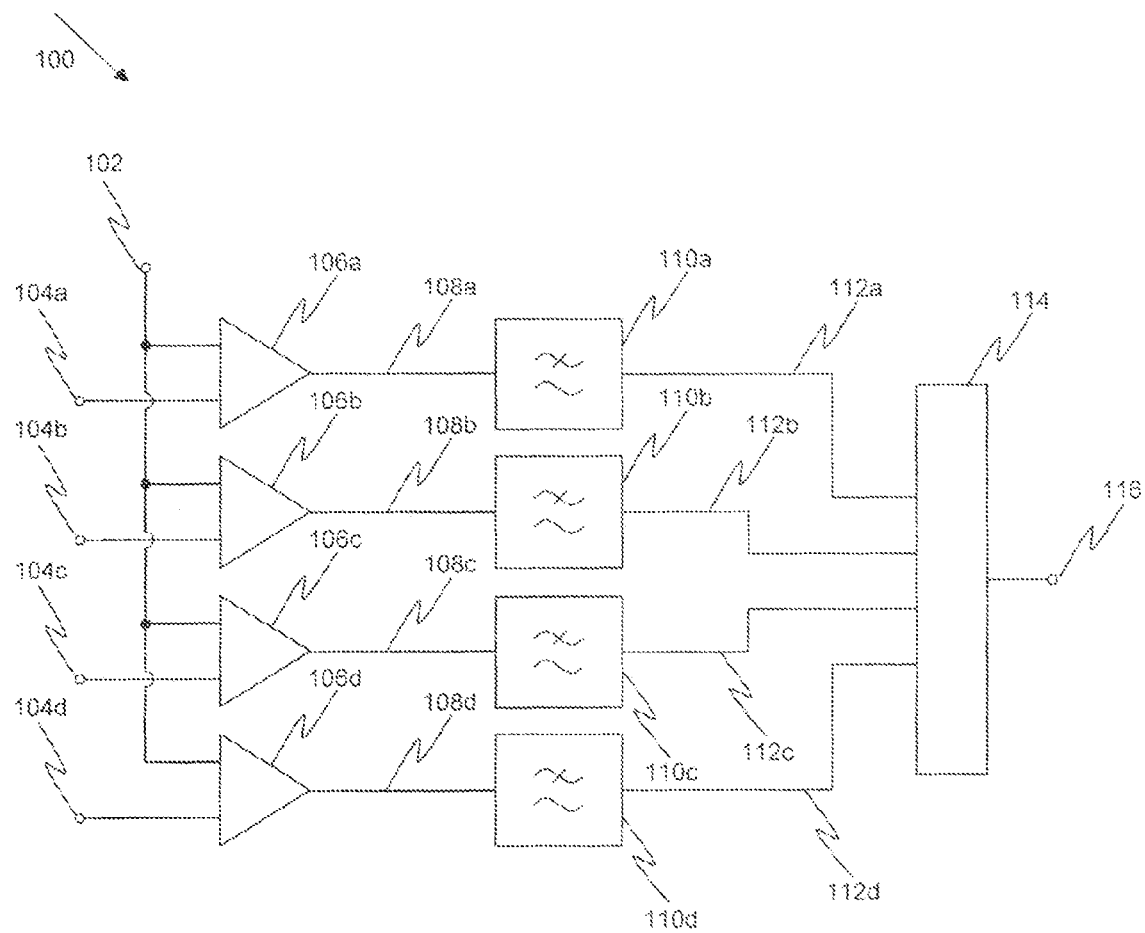
FIG. 2 shows a direct RF to digital converter 100 according to embodiments.

FIG. 2 shows a direct RF to digital converter 100 according to further embodiments of the disclosure. The operation of input signal 102, reference voltages 104a and 104b, comparators 106a and 106b, comparison signals 108a and 108b, filters 110a and 110b, filtered signals 112a and 112b, and digital output signal 116 are similar to as described previously in relation to FIG. 1a. In addition to reference voltages 104a and 104b, further reference voltages 104c and 104d are provided. Reference voltages 104a, 104b, 104c and 104d are distributed over the operating voltage range of RF to digital converter 100. Again, reference voltages 104 may be generated by a resistor ladder arrangement.

In addition to comparators 106a and 106b, further comparators 106c and 106d are provided to compare the magnitude of RF input signal 102, with reference voltages 104c and 104d respectively. The result of the comparison operations performed by comparators 106c and 106d is to generate comparison signals 108c and 108d respectively. Comparison signals 108c and 108d are generated in a similar manner to as described previously in relation to FIG. 1a.

Comparison signals 108c and 108d are then filtered by further filters 110c and 110d respectively to generate filtered signals 112c and 112d (similarly to the operation of filters 110a and 110b on comparison signals 108a and 108b to generate filtered signals 112a and 112b). By filtering comparison signals 108c and 108d, filters 112c and 112d act to isolate a data component of RF input signal 102 from unwanted signals or signal components. Filters 110c and 110d may be constructed in a similar manner to as described previously in relation to FIG. 1a.

In the embodiments shown in FIG. 2, generator 114 is further adapted to combine filtered signals 112a, 112b, 112c and 112d to generate digital output signal 116. According to embodiments of the disclosure, generator 114 includes digital logic circuitry for converting filtered signals 112a and 112b into a binary coded representation thereof. According to embodiments, one or more of filtered signals 112a, 112b, 112c and 112d comprise thermometer coded signals. According to embodiments, filtered signals 112a, 112b, 112c and 112d combine to form a thermometer coded signal. According to embodiments, generator 114 includes a thermometer code to binary code converter.

By filtering each of the comparison signals 108 in parallel, direct RF to digital converter 100 enables the necessary filtering to be performed by single bit digital filters, which are fast, require low silicon area, have low current consumption and are efficiently scalable. Additional quantization levels can continue to be added in this manner until the required resolution is achieved.

Whilst in the embodiments shown in FIG. 2 each comparison signal is filtered separately, in further embodiments, one or more of the filters is adapted to operate on more than one of the generated comparison signals.

Figure 3:
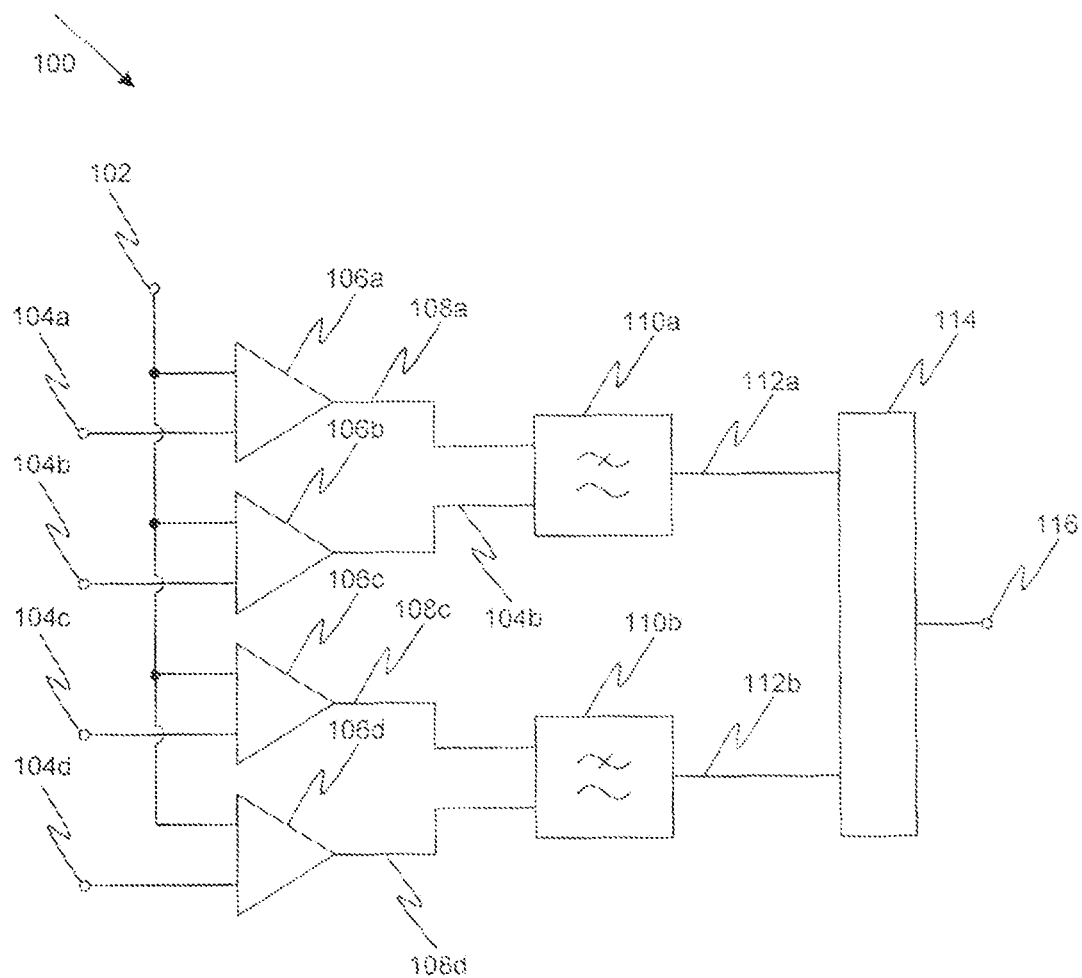
FIG. 3 shows a direct RF to digital converter 100 according to embodiments.

FIG. 3 shows a direct RF to digital converter 100 according to further embodiments of the disclosure. The operation of input signal 102, reference voltages 104a, 104b, 104c and 104d, comparators 106a, 106b, 106c and 106d, comparison signals 108a, 108b, 108c and 108d and digital output signal 116 are similar to as described previously in relation to FIG. 2. However, in these embodiments, filters 110a and 110b are each adapted to filter a subset of the plurality of generated comparison signals. In the embodiments shown in FIG. 3, filter 110a is adapted to generate filtered signal 112a by performing a two bit filtering operation on comparison signals 108a and 108b. Similarly, filter 110b is adapted to generate filtered signal 112b by performing a two bit filtering operation on comparison signals 108a and 108b. Generator 114 is adapted to combine filtered signals 112a and 112b to generate digital output signal 116.

In the embodiments shown in FIG. 3, each filter (110a, 110b) is adapted to operate on two comparison signals. In further embodiments, each filter is adapted to operate on larger subsets of the plurality of comparison signals. For example, in an embodiment where six comparators are used to generate six comparison signals, each of two filters may operate on a subset of three of the plurality of generated comparison signals, or each of three filters may operate on a subset of two of the plurality of generated comparison signals etc. According to embodiments, each filter operates on a different subset of the plurality of comparison signals. According to embodiments, each filter operates on a mutually exclusive subset of the plurality of comparison signals.

According to embodiments, further filters are provided in series to provide further filtering in addition to the parallel filtering discussed in the above embodiments.

Figure 4:
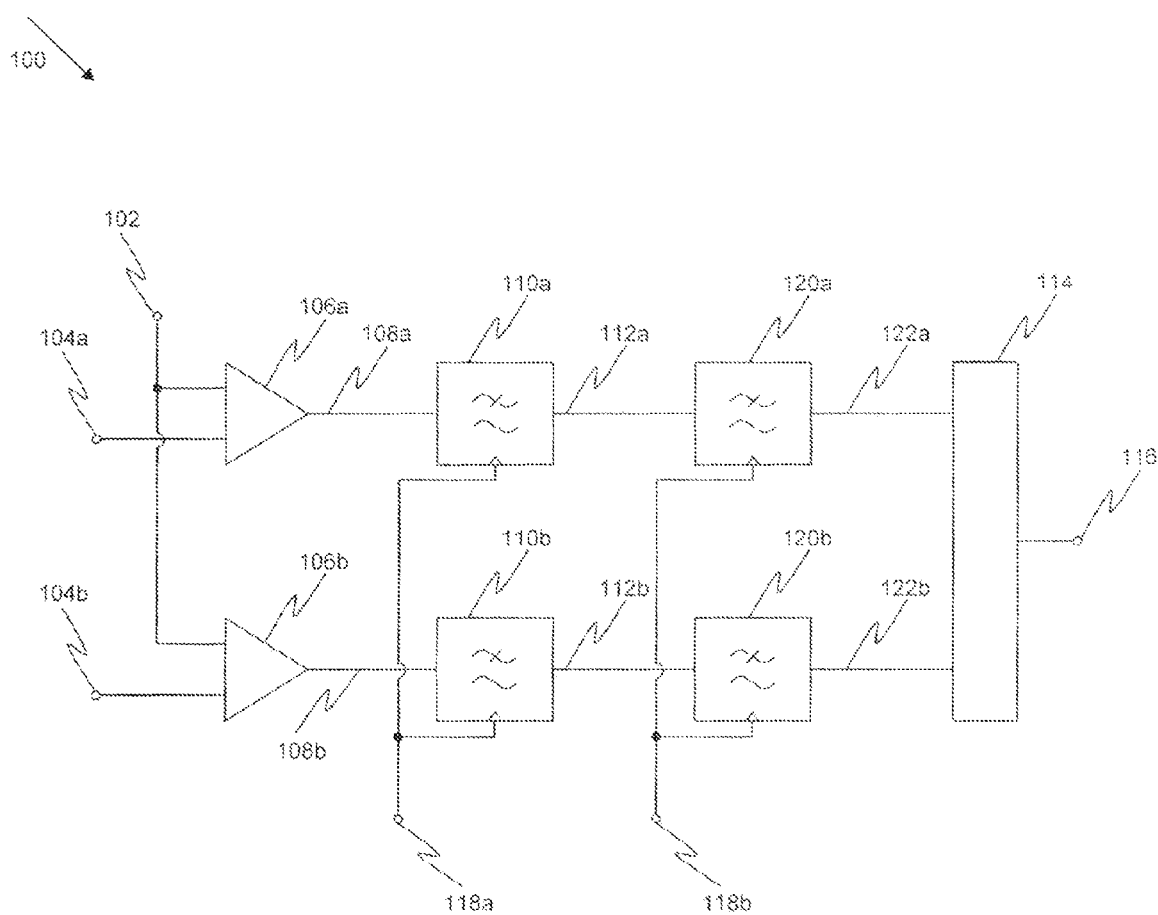
FIG. 4 shows a direct RF to digital converter 100 according to embodiments.

FIG. 4 shows a direct RF to digital converter 100 according to embodiments. The operation of input signal 102, reference voltages 104a and 104b, comparators 106a and 106b, comparison signals 108a and 108b, filters 110a and 110b, filtered signals 112a and 112b, generator 114 and digital output signal 116 are similar to as described previously in relation to FIG. 1a. However, in the embodiments shown in FIG. 4, further filters 120a and 120b are provided. Further filter 120a is adapted to generate further filtered signal 122a by further filtering filtered signal 112a. Similarly, further filter 120b is adapted to generate further filtered signal 122b by further filtering filtered signal 112b. The operation of further filters 120a and 120b is otherwise similar to filters 110a and 110b. Generator 114 is adapted to combine further filtered signals 122a and 122b to generate digital output signal 116. As further filtered signals 122a and 122b are further filtered versions of filtered signals 112a and 112b respectively, digital output signal 116 can be considered to be generated on the basis of filtered signals 112a and 112b, as well as further filtered signals 122a and 122b. According to embodiments, one or more of further filtered signals 122a and 122b comprise thermometer coded signals. According to embodiments, further filtered signals 122a and 122b combine to form a thermometer coded signal. According to embodiments, generating digital output signal 116 includes performing a thermometer code to binary code conversion on the combination of further filtered signals 122a and 122b.

According to embodiments, clock signals 118a and 118b are supplied to direct RF to digital converter 100. According to the embodiments shown in FIG. 4, clock signal 118a is supplied to filters 110a and 110b as described previously in relation to FIG. 1c, and serves to determine the sampling rate of direct RF to digital converter 100. According to alternative embodiments, clock signal 118a is supplied to comparators 106a and 106b, as shown previously in FIG. 1b. According to further embodiments, clock signal 118a is provided to both comparators 106a and 106b and filters 110a and 110b.

Clock signal 118b is supplied to further filters 120a and 120b, and serves to determine the rate at which filtered signals 112a and 112b are sampled by further filters 120a and 120b respectively. Clock signal 118b supplied to further filters 120a and 120b also serves to determine the rate at which further filtered signals 122a and 122b are generated.

According to embodiments, the frequency of clock signal 118b is lower than clock signal 118a. In embodiments, the sampling rate of further filters 120a and 120b is lower than the sampling rate of filters 110a and 110b. This successive down-sampling and filtering enables the bit rate of the further filtered signals to be reduced, whilst still filtering out frequencies outside the frequency range of interest. By down-sampling, the bit rate can be reduced to a level suitable for processing by subsequent hardware components (e.g. digital signal processors) that are not capable of processing signals at the high bit rates required for the direct RF sampling used at filters 110a and 110b. According to embodiments, clock signal 118b is a rational fraction of clock signal 118a.

Whilst the embodiments of FIG. 4 provide further filtering through the addition of one additional series of further filters, additional series of yet further filters can be added sequentially in a similar manner until the required number of filter series is achieved. According to embodiments, further clock signals are supplied to each successive series of further filters, each clock signal having a successively lower frequency to thereby reduce the sampling rate at each filter stage.

Further, the down-sampling serves to alleviate the throughput requirements of the further filters compared to filters 110a and 110b. As a result, filters can be used that operate on larger word lengths whilst still meeting the necessary performance criteria.

Figure 5:
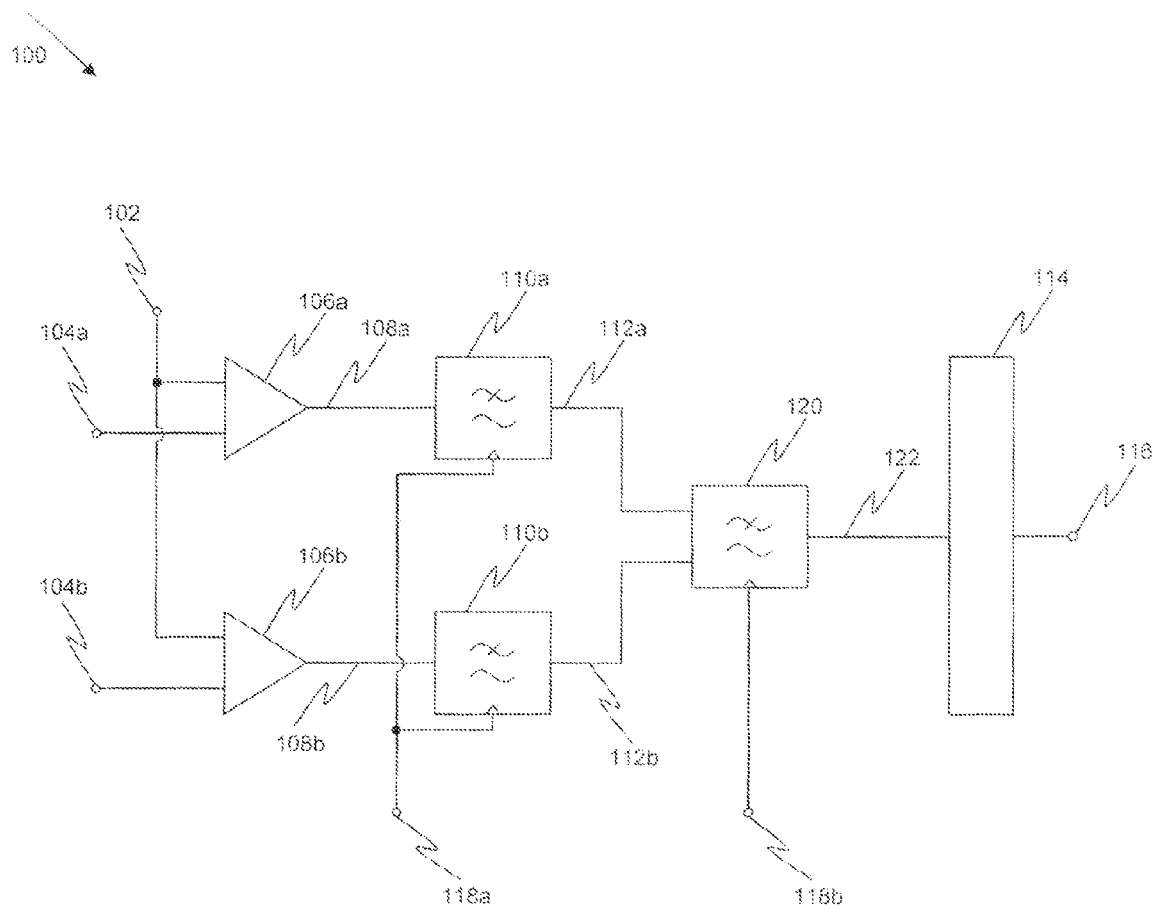
FIG. 5 shows a direct RF to digital converter 100 according to embodiments.

FIG. 5 shows a direct RF to digital converter 100 according to embodiments. The operation of input signal 102, reference voltages 104a and 104b, comparators 106a and 106b, comparison signals 108a and 108b, filters 110a and 110b, filtered signals 112a and 112b, clock signals 118a and 118b, generator 114 and digital output signal 116 are similar to as described previously in relation to FIG. 4. However, in the embodiments shown in FIG. 5, further filter 120 is provided. Further filter 120 is supplied with the lower frequency clock signal 118b, and therefore has a lower throughput requirement than filters 110a and 110b. The result of this is that further filter 120 can be designed to operate on a larger input word length than filters 110a and 110b. Further filter 120 is adapted to generate further filtered signal 122 by further filtering both filtered signals 112a and 112b. Generator 114 is adapted to generate digital output signal 116 on the basis of further filtered signal 122. As further filtered signal 122 is a further filtered version of the combination of filtered signals 112a and 112b, digital output signal 116 can be considered to be generated on the basis of filtered signals 112a and 112b, as well as further filtered signal 122.

According to embodiments, further filtered signal 122 comprises a thermometer coded signal. According to embodiments, generating digital output signal 116 includes performing a thermometer code to binary code conversion on further filtered signal 122.

In FIG. 5, further filter 120 is adapted to generate further filtered signal 122 by performing a filtering operation on two filtered signals (112a and 112b). According to embodiments where three or more filtered signals are generated, further filter 120 may be adapted to generate further filtered signal 122 by performing a filtering operation on more than two filtered signals.

Whilst the embodiments of FIG. 5 provide further filtering through the addition of one additional further filter, in further embodiments, more than one further filter is provided, each further filter being adapted to operate on a subset of the plurality of comparison signals. For example, in an embodiment where four filters are used to generate four filtered signals, each of two further filters may operate on two of the filtered signals. In an embodiment where six filters are used to generate six filtered signals, each of two further filters may operate on a subset of three of the filtered signals, or each of three further filters may operate on a subset of two of the filtered signals etc. According to embodiments, each further filter operates on a different subset of the filtered signals. According to embodiments, each further filter operates on a mutually exclusive subset of the filtered signals.

According to embodiments, additional series of yet further filters can be added in a similar manner until the required number of filter series is achieved. According to embodiments, further clock signals are supplied to each successive series of yet further filters, each clock signal having a successively lower frequency to thereby reduce the sampling rate at each filter stage. According to embodiments, the yet further filters in each series of yet further filters operate on larger word length signals.

According to embodiments, the filtering characteristics of one or more of the filters and or further filters are configurable. Hence, the direct RF to digital converter is able to be configured to be suitable for a range of input signals, e.g having differing bandwidths.

According to embodiments, a successive approximation converter (for example including a successive approximation register (SAR)) is used to operate on digital output signal 116, in combination with RF input signal 102 and at least one of the plurality of generated comparison signals, to generate a further digital output signal having a finer resolution. Successive approximation converters are known in the art and are used to more accurately identify the magnitude of an analogue input signal that falls within a known range. In these embodiments, the known range includes the area between two quantisation levels of direct RF to digital converter 100. Sufficient down-sampling by direct RF to digital converter 100 allows the bit rate of digital output signal 116 to be brought within the operating frequency range of conventional successive approximation converter architectures.

Figure 6:
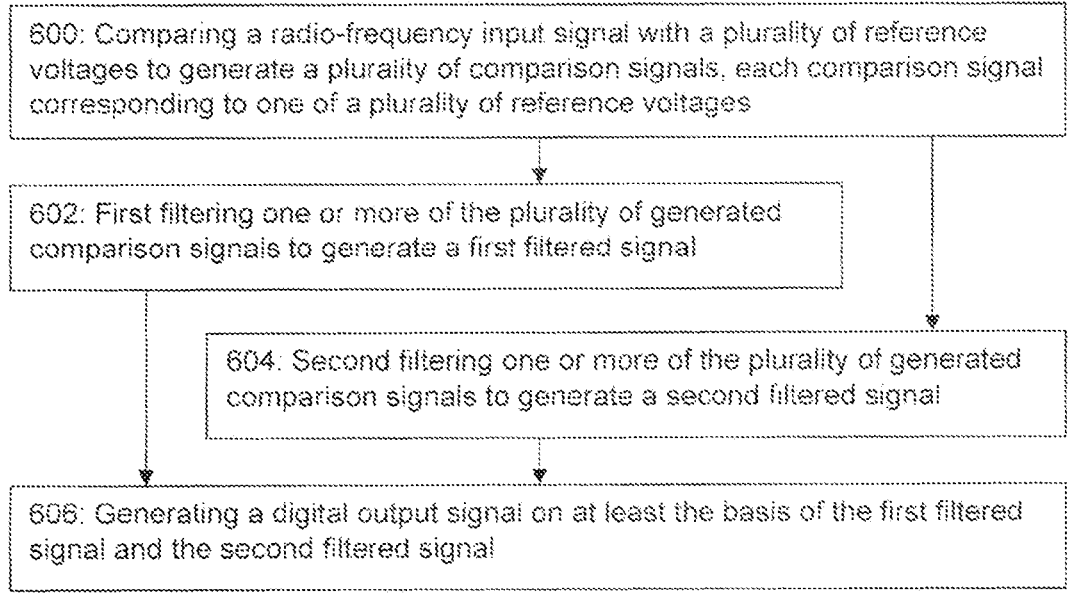
FIG. 6 shows a flow diagram according to embodiments.

FIG. 6 is a flow diagram that describes embodiments from the perspective of direct RF to digital converter 100. At step 600, a radio-frequency input signal is compared with a plurality of reference voltages to generate a plurality of comparison signals, each comparison signal corresponding to one of a plurality of reference voltages. At step 602, one or more of the plurality of generated comparison signals are first filtered to generate a first filtered signal. At step 604, one or more of the plurality of generated comparison signals are second filtered to generate a second filtered signal. At step 606, a digital output signal is generated on at least the basis of the first filtered signal and the second filtered signal.

Apparatus implementing embodiments may be implemented by one or more components such as the above described tangibly stored software, hardware, firmware, or a system-on-a-chip SOC or an application specific integrated circuit ASIC or a digital signal processor DSP or a modem or a subscriber identity module (such as a SIM card).

It will be understood that data processing tasks referred to herein may in practice be provided by a single chip or integrated circuit or plural chips or integrated circuits, optionally provided as a chipset, an application-specific integrated circuit (ASIC), field-programmable gate array (FPGA), etc. The chip or chips may include circuitry (as well as possibly firmware) for embodying at least one or more of a data processor or processors, a digital signal processor or processors, baseband circuitry and radio frequency circuitry, which are configurable so as to operate in accordance with embodiments. In this regard, embodiments may be implemented at least in part by computer software stored in (non-transitory) memory and executable by the processor, or by hardware, or by a combination of tangibly stored software and hardware (and tangibly stored firmware).

Although at least some aspects of the embodiments described herein with reference to the drawings include computer software embodiments also extend to computer programs, particularly computer programs on or in a carrier, adapted for putting embodiments into practice. The program may be in the form of non-transitory source code, object code, a code intermediate source and object code such as in partially compiled form, or in any other non-transitory form suitable for use in the implementation of processes according to embodiments. The carrier may be any entity or device capable of carrying the program. For example, the carrier may comprise a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc The above embodiments are to be understood as illustrative examples. Further embodiments are envisaged. For example, the embodiments described above can be applied to input signals of any frequency, and are not limited to those of radio-frequency. Further, any combinations of sequential parallel filtering and down sampling operations may be employed. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of embodiments, which is defined in the accompanying claims.

What is claimed is:

1. A method of performing direct radio-frequency to digital data component conversion, the method comprising operating radio circuitry to perform at least the following:
    comparing a radio-frequency input signal with a plurality of reference voltages to generate a plurality of comparison signals, each comparison signal corresponding to one of the plurality of reference voltages;
    first filtering one or more of the plurality of generated comparison signals to generate a first filtered signal;
    second filtering one or more of the plurality of generated comparison signals to generate a second filtered signal; and
    generating a digital output signal at least on the basis of the first filtered signal and the second filtered signal, wherein the first filtering and the second filtering act to isolate a data component of the radio-frequency input signal.

2. The method according to claim 1, wherein the first filtering is performed on a first subset of the plurality of generated comparison signals and the second filtering is performed on a second, different, subset of the plurality of generated comparison signals.

3. The method according to claim 1, wherein each comparison signal in the plurality of generated comparison signals corresponds to a different one of the plurality of reference voltages.

4. The method according to claim 1, comprising sampling the plurality of comparison signals at a predetermined sampling rate, prior to generating the first filtered signal and the second filtered signal.

5. The method according to claim 4, wherein each of the sampled comparison signals in the plurality of sampled comparison signals consists of a single bit.

6. The method according to claim 4, wherein the predetermined sampling rate is substantially equal to a carrier frequency of the radio-frequency input signal.

7. The method according to claim 4, wherein the sampling is performed according to a predetermined relationship in relation to a phase of a carrier component of the radio-frequency input signal.

8. The method according to claim 4, wherein the generation of the plurality of comparison signals comprises sampling the plurality of comparison signals.

9. The method according to claim 4, wherein at least one of the first filtering and the second filtering comprises sampling the plurality of comparison signals.

10. The method according to claim 1, wherein one or more of the first filtered signal and the second filtered signal comprise multiple bits and/or one or more of the first filtered signal and the second filtered signal comprise thermometer coded signals.

11. The method according to claim 1, wherein generating the digital output signal comprises combining at least the first filtered signal and the second filtered signal.

12. The method according to claim 11, wherein generating the digital output signal comprises performing a thermometer code to binary code conversion on a combination of the at least first filtered signal and second filtered signal.

13. The method according to claim 1, comprising, prior to generating the digital output signal, third filtering at least the first filtered signal to generate a third filtered signal, wherein the digital output signal is generated further on the basis of the third filtered signal.

14. The method according to claim 13, wherein the third filtered signal comprises a thermometer coded signal.

15. The method according to claim 13, wherein generating the digital output signal comprises performing a thermometer code to binary code conversion on at least the third filtered signal.

16. The method according to claim 13, comprising:
sampling the plurality of comparison signals at a predetermined sampling rate, prior to generating the first filtered signal and the second filtered signal; and
sampling the first filtered signal at a further predetermined sampling rate prior to performing the third filtering operation.

17. The method according to claim 16, wherein the further predetermined sampling rate is of a lower rate than the predetermined sampling rate and/or the further predetermined sampling rate is a rational fraction of the predetermined sampling rate.

18. The method according to claim 13, wherein the third filtering further comprises third filtering the second filtered signal to generate the third filtered signal.

19. The method according to claim 13, comprising prior to generating the digital output signal, fourth filtering the second filtered signal to generate a fourth filtered signal, wherein the digital output signal is generated further on the basis of the third filtered signal and the fourth filtered signal.

20. The method according to claim 1, wherein the plurality of generated comparison signals comprise thermometer coded signals.

21. The method according to claim 1, wherein one or more of the following are configurable:
voltage levels of one or more of the plurality of reference voltages,
filtering characteristics of one or more of the filtering operations, and
at least one predetermined sampling rate at which the plurality of comparison signals are sampled.

22. The method according to claim 1, comprising generating a further digital output signal by performing a successive approximation conversion operation on the digital output signal, the radio-frequency input signal and at least one of the plurality of generated comparison signals.

23. A direct radio-frequency to digital data component conversion apparatus, the apparatus comprising:
a comparator, adapted to compare a radio-frequency input signal with a plurality of reference voltages to generate a plurality of comparison signals, each comparison signal corresponding to one of the plurality of reference voltages;
a first filter, adapted to filter one or more of the plurality of generated comparison signals to generate a first filtered signal;
a second filter, adapted to filter one or more of the plurality of generated comparison signals to generate a second filtered signal; and
a generator, adapted to generate, a digital output signal on the basis of at least the first filtered signal and the second filtered signal, wherein the first filtering and the second filtering act to isolate a data component of the radio-frequency input signal.

24. A computer program product comprising a non-transitory computer-readable storage medium having computer readable instructions stored thereon, the computer readable instructions being executable by a computerized device to cause the computerized device to perform direct radio-frequency to digital data component conversion by at least:
comparing a radio-frequency input signal with a plurality of reference voltages to generate a plurality of comparison signals, each comparison signal corresponding to one of the plurality of reference voltages;
first filtering one or more of the plurality of generated comparison signals to generate a first filtered signal;
second filtering one or more of the plurality of generated comparison signals to generate a second filtered signal; and
generating a digital output signal at least on the basis of the first filtered signal and the second filtered signal, wherein the first filtering and the second filtering act to isolate a data component of the radio-frequency input signal.

* * * * *